(12) United States Patent
Latal et al.

(10) Patent No.: US 7,760,514 B2
(45) Date of Patent: Jul. 20, 2010

(54) FASTENING SUPPORT ASSEMBLY

(75) Inventors: James F. Latal, Palatine, IL (US); Mark Downing, Hoffman Estates, IL (US)

(73) Assignee: Illinois Tool Works, Glenview, IL (US)

( * ) Notice: Subject to any disclaimer, the term of this patent is extended or adjusted under 35 U.S.C. 154(b) by 879 days.

(21) Appl. No.: 11/636,245

(22) Filed: Dec. 8, 2006

(65) Prior Publication Data
US 2008/0137313 A1 Jun. 12, 2008

(51) Int. Cl.
*H05K 7/12* (2006.01)

(52) U.S. Cl. .................. 361/804; 361/742; 361/770; 361/758; 174/138 E; 174/138 G (58) Field of Classification Search ............. 361/742, 361/758, 770, 804; 174/138 E, 138 G
See application file for complete search history.

(56) References Cited

U.S. PATENT DOCUMENTS

| | | | | |
|---|---|---|---|---|
| 4,674,930 A | * | 6/1987 | Poe et al. ............... | 411/40 |
| 4,970,761 A | * | 11/1990 | Nakamura ............... | 24/453 |
| 7,262,976 B2 | * | 8/2007 | Yu ....................... | 361/807 |
| 7,349,222 B2 | * | 3/2008 | Kim ...................... | 361/758 |
| 7,394,666 B2 | * | 7/2008 | Edwards et al. ......... | 361/803 |
| 7,466,562 B2 | * | 12/2008 | Gilliland et al. ......... | 361/803 |

* cited by examiner

*Primary Examiner*—Dameon E Levi
(74) *Attorney, Agent, or Firm*—Mark W. Croll; Paul F. Donovan

(57) ABSTRACT

Embodiments of the present invention provide a fastening support assembly configured to securely connect a first panel above a second panel. The fastening support assembly includes a shaft having a cap at a first end and a distal tip at a second end. The shaft defines an internal chamber. The distal tip is configured to secure to the first panel. A pin is positioned within the internal chamber, wherein movement of the pin into the internal chamber radially expands the shaft. A portion of the shaft and the pin proximate the cap are configured to substantially fill a hole formed through the second panel when the second panel is secured to the fastening support assembly.

14 Claims, 9 Drawing Sheets

FASTENING SUPPORT ASSEMBLY

FIELD OF THE INVENTION

Embodiments of the present invention generally relate to a fastener assembly, and more particularly, to a standoff fastener assembly that may be configured for use with circuit boards.

BACKGROUND OF THE INVENTION

Many circuit boards are securely connected to a chassis or frame, such as sheet metal, through fastening supports having a flexible W-shaped base. Typically, the W-shaped base securely mates into a hole within the chassis, while a distal tip of the support securely mates within a hole of the circuit board. The distal tip of the support may also include a flexible W-shaped design.

Figure 1:
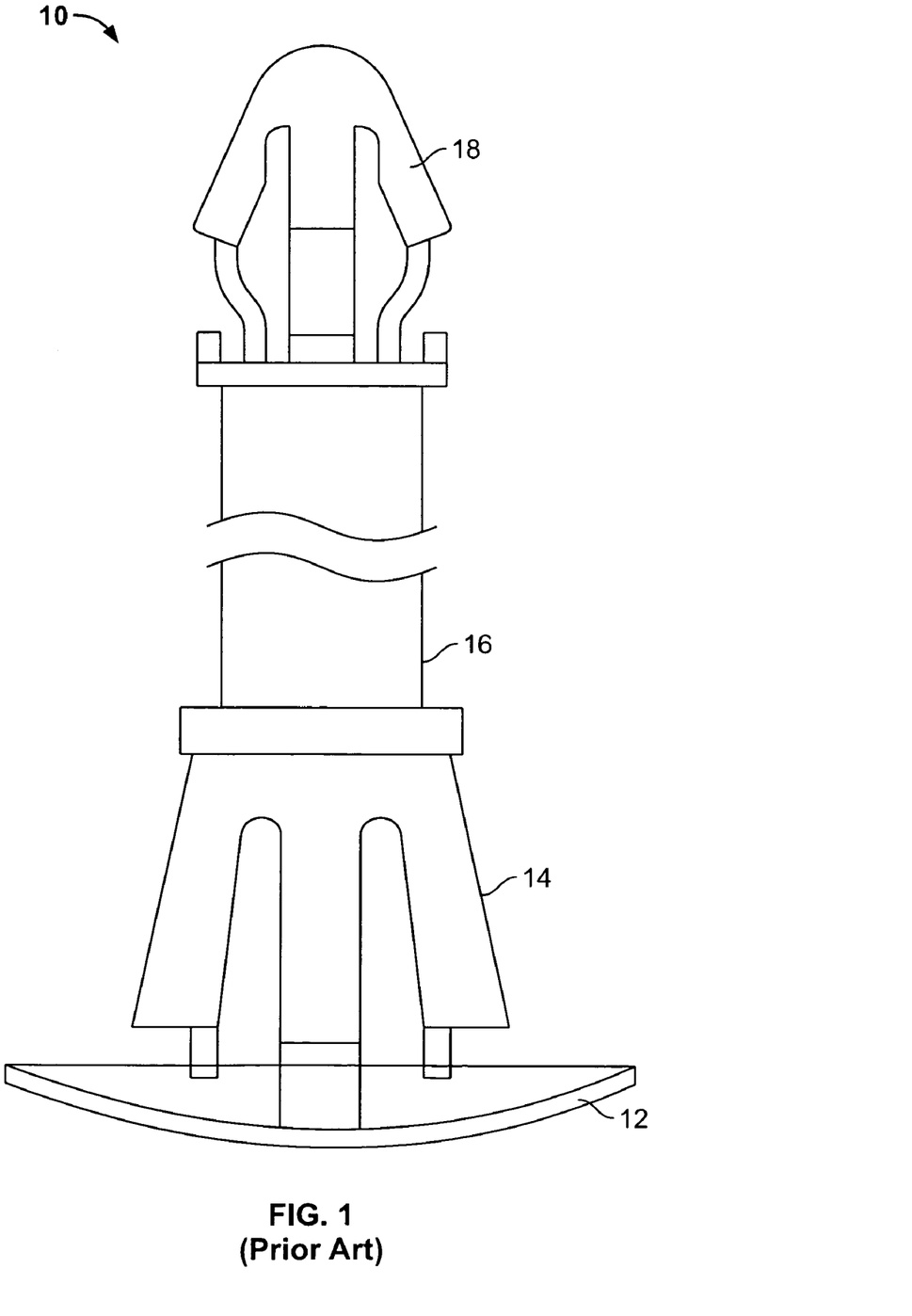
FIG. 1 illustrates a front view of a conventional fastening support.

FIG. 1 illustrates a front elevation view of a conventional fastening support 10. The support 10 includes a cap 12 integrally formed with a W-shaped base 14. The W-shaped base 14 is, in turn, integrally formed with a shaft 16 that integrally connects to a W-shaped tip 18.

Figure 2:
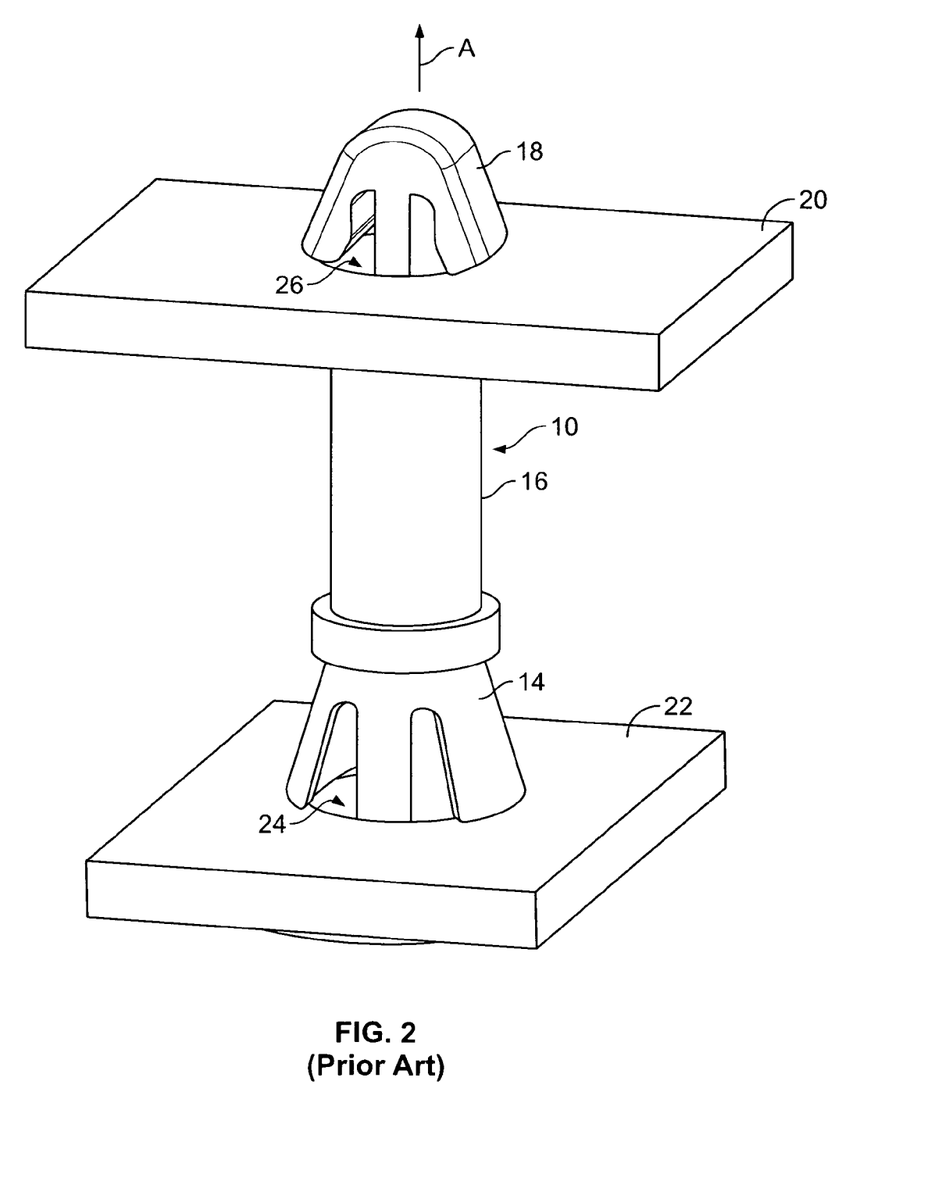
FIG. 2 illustrates a front isometric view of a conventional fastening support securely supporting a circuit board above a chassis.
Figure 3:
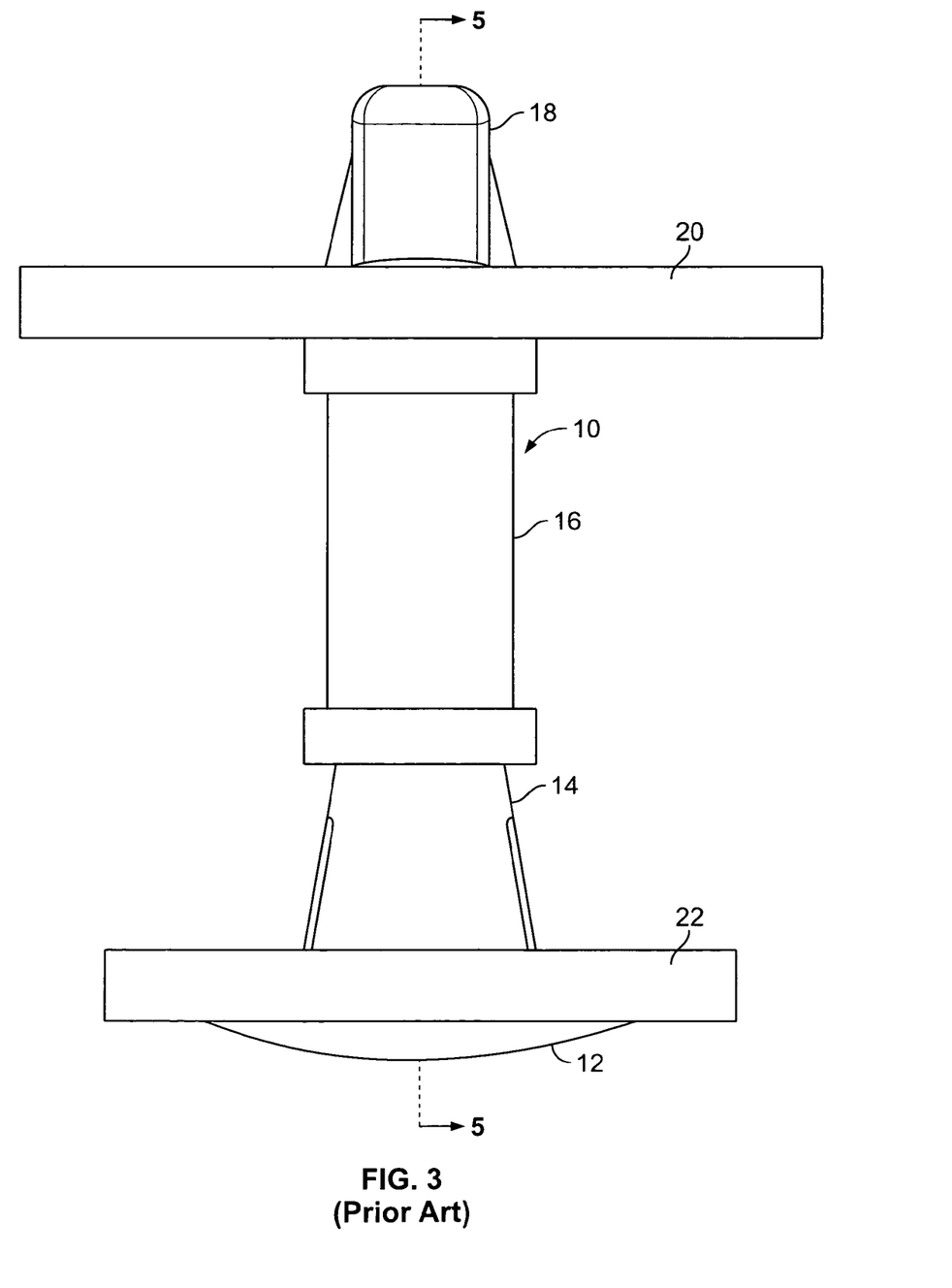
FIG. 3 illustrates a lateral elevation view of a conventional fastening support securely supporting a circuit board above a chassis.
Figure 4:
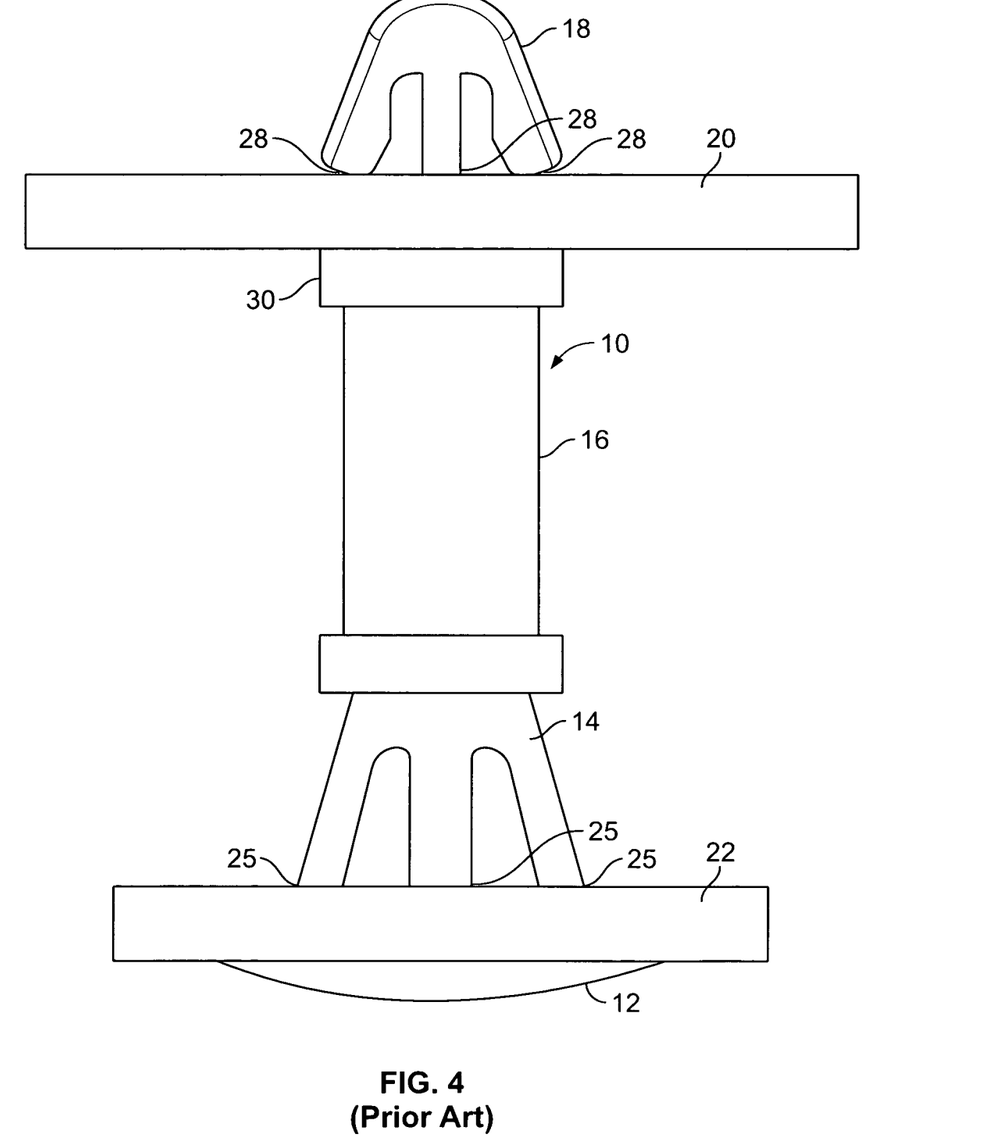
FIG. 4 illustrates a front elevation view of a conventional fastening support securely supporting a circuit board above a chassis.

FIG. 2 illustrates a front isometric view of the conventional fastening support 10 securely supporting a circuit board 20 above a chassis 22. FIGS. 3 and 4 illustrate lateral and front elevation views, respectively, of the conventional fastening support 10 securely supporting the circuit board 20 above the chassis 22.

Referring to FIGS. 2-4, in order to connect the fastening support 10 to the chassis 22, the tip 18 is passed through a hole 24 in the chassis 22 in the direction of arrow A. The fastening support 10 is continually urged in the direction of arrow A until the W-shaped base 14 snapably secures into the hole 24. The area around the hole 24 is compressively sandwiched between arm ends 25 of the base 14 and the cap 12.

Once the base 14 is secured into the hole 24, the circuit board 20 may be secured to the tip 18. Similar to the base 14 snapably securing into the hole 24 of the chassis 22, the tip 18 snapably secures into a hole 26 formed in the circuit board 20. The area around the hole 26 is compressively sandwiched between arm ends 28 of the tip 18 and an annular ring 30 that integrally surrounds a distal end of the shaft 16. Thus, the fastening support 10 securely supports the circuit board 20 above the chassis 22.

Figure 5:
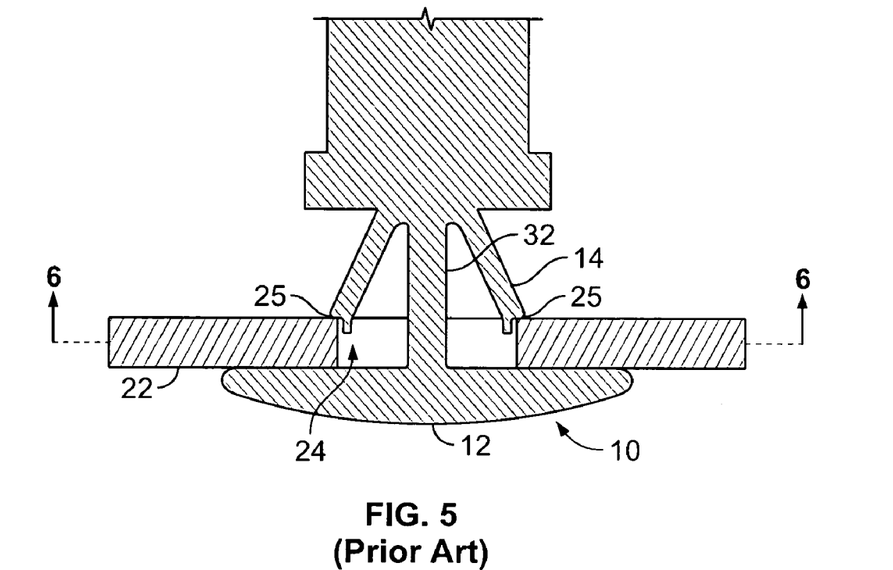
FIG. 5 illustrates a cross-sectional view of a conventional fastening support through line 5-5 of FIG. 3.

FIG. 5 illustrates a cross-sectional view of the fastening support 10 through line 5-5 of FIG. 3. As shown more clearly in FIG. 5, the chassis 22 is compressively sandwiched between the arm ends 25 and the cap 12. A central wall or arm 32 of the base 14 integrally connects to the cap 12 and is disposed through the hole 24.

Figure 6:
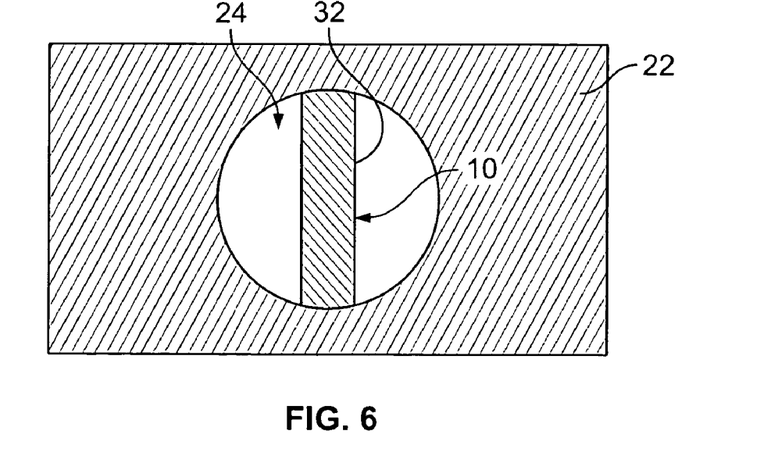
FIG. 6 illustrates a cross-sectional view of a central arm of a conventional fastening support through line 6-6 of FIG. 5.

FIG. 6 illustrates a cross-sectional view of the central arm 32 of the fastening support 10 through line 6-6 of FIG. 5. The central arm 32 provides the only bracing support for the fastening support 10 within the hole 24. The base 14 is susceptible to breaking or snapping from shearing forces due to the minimal cross-section of the base 14, that is, the central arm 32, within the hole 24. Once the base 14 is secured to the chassis 22, only the narrow central arm 32 of the base 14 remains in the hole 24. If the chassis 22 is a piece of thin sheet metal, all of the stress of a shearing force is concentrated in the central arm 32, which approximately spans the diameter of the center of the hole 24. As such, the conventional fastening support 10 is susceptible to snapping or otherwise breaking at or around the central arm 32.

Thus, a need exists for a more resilient, robust fastening support assembly.

SUMMARY OF THE INVENTION

Certain embodiments of the present invention provide a fastening support assembly configured to securely connect a first panel above a second panel. The fastening support assembly includes a shaft having a cap at a first end and a distal tip at a second end. The shaft defines an internal chamber. The distal tip is configured to secure to the first panel. A pin is positioned within the internal chamber, wherein movement of the pin into the internal chamber radially expands the shaft. A portion of the shaft and the pin proximate the cap are configured to substantially fill a hole formed through the second panel when the second panel is secured to the fastening support assembly.

A circumferential area of the shaft configured to be within the hole may be configured to abut circumferential edges of the second panel that define the hole. Moreover, the pin fills an internal space formed through the shaft proximate the cap. The second panel may be configured to be compressively sandwiched between the shaft and the cap when the pin radially expands the shaft.

Certain embodiments of the present invention provide a fastening support system including a chassis, a circuit, and a fastening support assembly. The chassis has a first hole formed therethrough, while the circuit has a second hole formed therethrough.

The fastening support assembly securely supports the circuit board with respect to the chassis. The fastening support assembly includes a shaft having a cap at a first end and a distal tip at a second end, and a pin.

The shaft defines an internal chamber. A portion of the shaft proximate the cap is positioned within the first hole. The distal tip securely mates into the second hole.

The pin is positioned within the internal chamber. Movement of the pin into the internal chamber radially expands the shaft in order to secure the shaft into the first hole. A cross-sectional area of the shaft and the pin proximate the cap substantially fills the first hole.

Before the embodiments of the invention are explained in detail, it is to be understood that the invention is not limited in its application to the details of construction and the arrangement of the components set forth in the following description or illustrated in the drawings. The invention is capable of other embodiments and of being practiced or being carried out in various ways. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof.

DETAILED DESCRIPTION OF THE INVENTION

Figure 7:
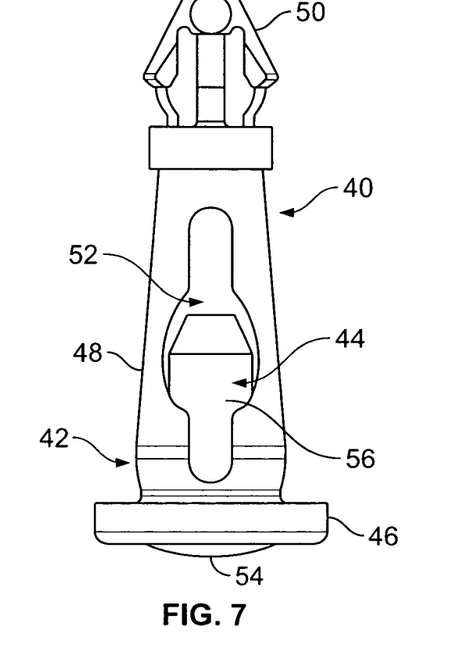
FIG. 7 illustrates a front elevation view of a fastening support assembly according to an embodiment of the present invention.
Figure 8:
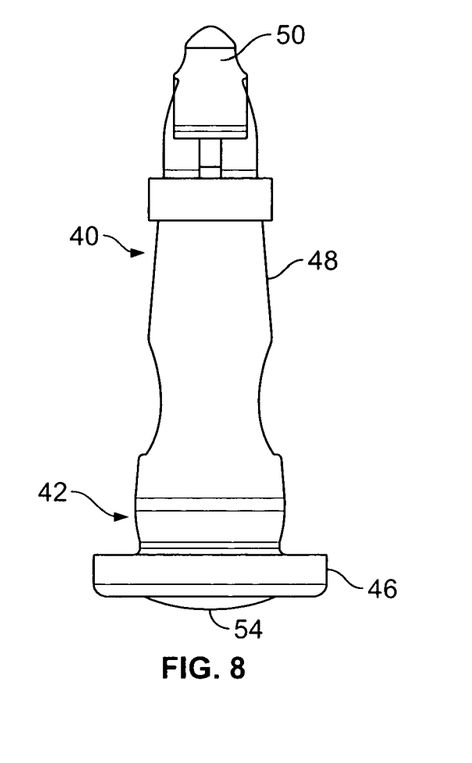
FIG. 8 illustrates a lateral elevation view of a fastening support assembly according to an embodiment of the present invention.

FIGS. 7 and 8 illustrate front and lateral elevation views, respectively, of a fastening support assembly 40 according to an embodiment of the present invention. Referring to FIGS. 7 and 8, the fastening support assembly 40 includes a main body 42 and a separate and distinct pin 44 within the main body 42. Both the main body 42 and the pin 44 may be formed of plastic.

The main body 42 includes a cap 46 integrally formed with a shaft 48, which, in turn, is integrally formed with a distal tip 50. As shown in FIGS. 7 and 8, the diameter of the shaft 48 is greatest proximate the cap 46, and smallest proximate the distal tip 50. Optionally, however, the diameter of the shaft 48 may be uniform throughout. The cap 46 includes a pin-hole (not shown) that allows the pin 44 to pass into an internal chamber 52 within the shaft 48. The pin 44 includes a head 54 integrally connected to a pin shaft 56. As the pin 44 passes into the internal chamber 50, the pin 44 is urged into the interior walls of the shaft 48, thereby spreading the shaft 48 open. The pin 44 passes into the internal chamber 52 until the head 54 abuts against edges that define the pin-hole.

Figure 9:
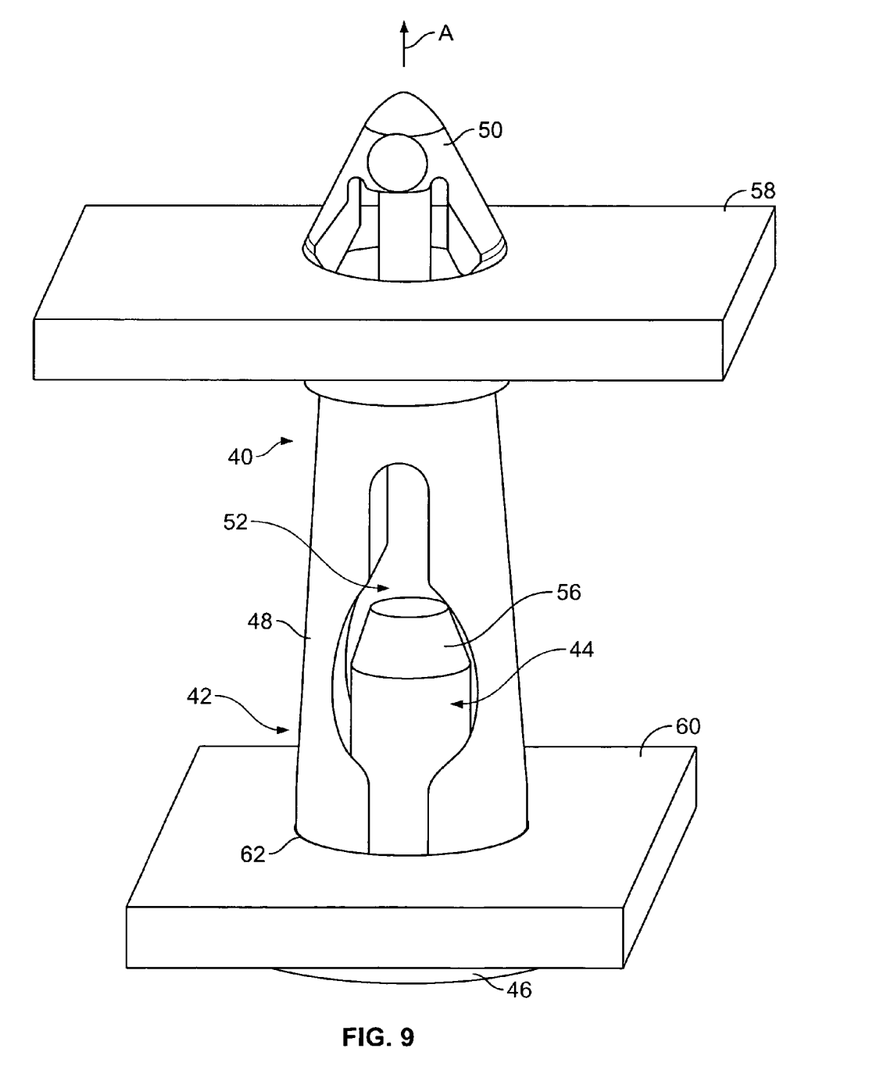
FIG. 9 illustrates an isometric front view of a fastening support assembly securely supporting a circuit board above a chassis according to an embodiment of the present invention.
Figure 10:
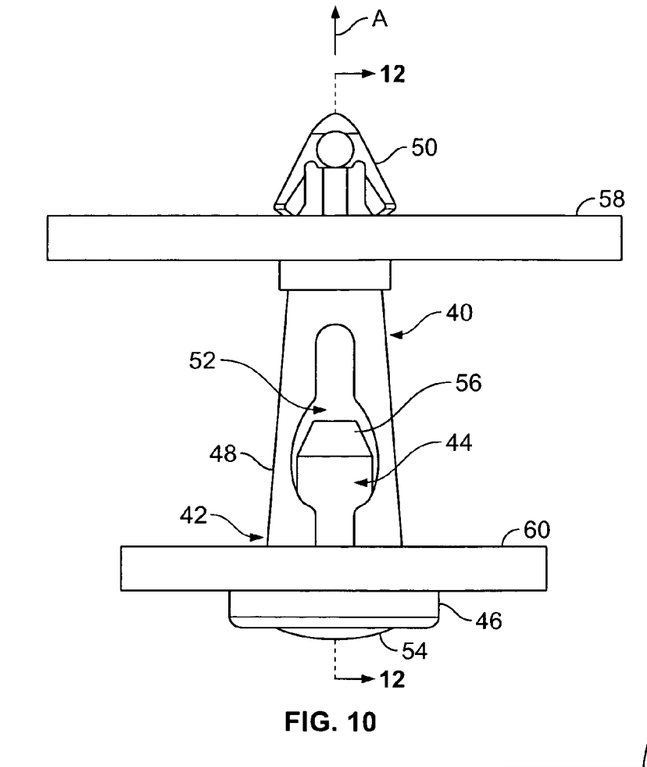
FIG. 10 illustrates a front elevation view of a fastening support assembly securely supporting a circuit board above a chassis according to an embodiment of the present invention.
Figure 11:
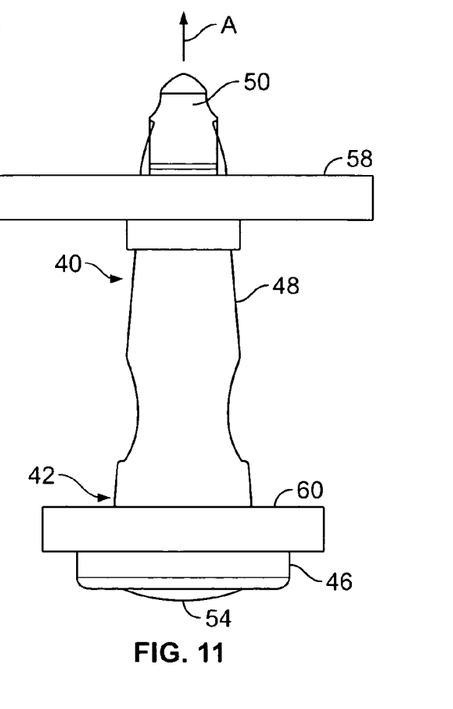
FIG. 11 illustrates a lateral elevation view of a fastening support assembly securely supporting a circuit board above a chassis according to an embodiment of the present invention.

FIG. 9 illustrates an isometric front view of the fastening support assembly 40 securely supporting a circuit board 58 above a chassis 60 according to an embodiment of the present invention. FIGS. 10 and 11 illustrate front and lateral elevation views, respectively, of the fastening support assembly 40 securely supporting the circuit board 58 above the chassis 60.

Referring to FIGS. 9-11, in order to secure the chassis 60 to the fastening support assembly 40, the main body 42 is passed through a hole 62 formed in the panel 60 in the direction of arrow A. The main body 42 continues to pass through the hole 62 until the cap 46 abuts the area of the chassis 60 that defines the hole 62. The diameter of the hole 62 is smaller than the diameter of the cap 46. Thus, the cap 46 is prevented from slipping through the hole 62.

Once the chassis 60 abuts the cap 46. the pin shaft 56 is passed through the pin-hole (not shown) in the cap 46 in the direction of arrow A. As the pin shaft 56 passes into the internal chamber 52 of the shaft 48 of the main body 42, the pin shaft 56 moves into internal walls of the shaft 46, thereby spreading or otherwise flaring the shaft 46 open. As the shaft 46 of the main body 42 spreads open, the diameter of the shaft 46 around the pin 44 expands. Thus, the pin 44 secures the shaft 46 into the hole 62. The pin 44 is continually urged into the internal chamber 52 until the head 54 abuts against the edges of the cap 46 that define the pin-hole. The diameter of the pin-hole is smaller than that of the head 54, thereby preventing the head 54 from slipping through the pin-hole.

The tip 50 of the fastening support assembly 40 secures to the circuit board 58 in a similar fashion as that described above with respect to FIGS. 2-4. That is, the tip 50 may snapably secure into a hole formed through the circuit board 58.

Figure 12:
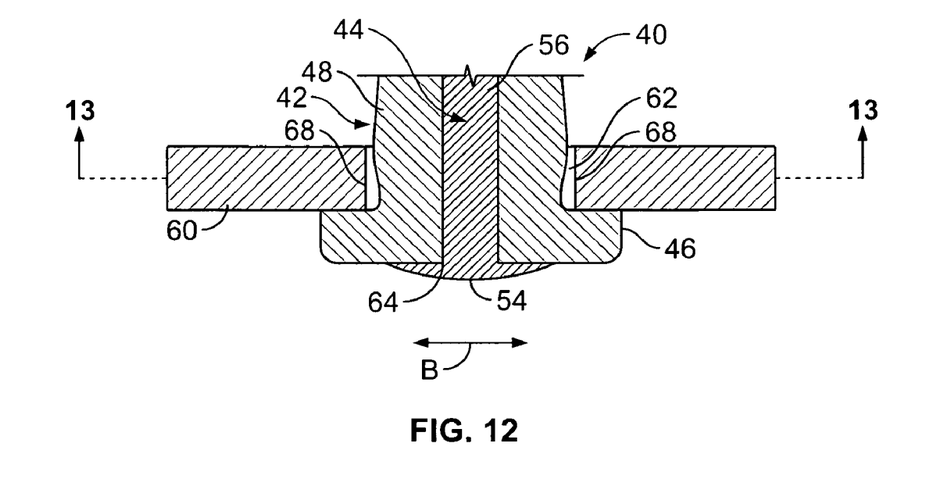
FIG. 12 illustrates a cross-sectional view of a shaft of a fastening support assembly through line 12-12 of FIG. 10 according to an embodiment of the present invention.

FIG. 12 illustrates a cross-sectional view of the shaft 48 of the fastening support assembly 10 through line 12-12 of FIG. 10. As discussed above, the insertion of the pin shaft 56 through the pin-hole 64 of the cap 46 into the internal chamber 52 of the shaft 48 of the main body 42 radially expands the shaft 48 in the directions of arrows B. The shaft 48 may expand such that the portion of the shaft 48 within the hole 62 abuts into edges 68 of the chassis 60 that define the hole 62, or just above the chassis 62. Thus, the portion of the shaft 48 proximate the cap 46 acts as a fastening base that compressively sandwiches the chassis 60 between it and the cap 46. Moreover, the portion of the radially-expanded shaft 48 within the hole 62 may provide an interference fit with the edges 68 that define the hole 62, thereby providing a more snug connection.

As shown in FIG. 12, the hole 62 of the chassis 60 is completely or substantially occupied by solid material defined by the pin shaft 56 and the shaft 48 of the main body 42. The solid, contiguous portion of the fastening support assembly 40 within the hole 62 provides a robust and reliable connection that is not susceptible to snapping or breaking due to shear forces exerted on the fastening support assembly 40.

Figure 13:
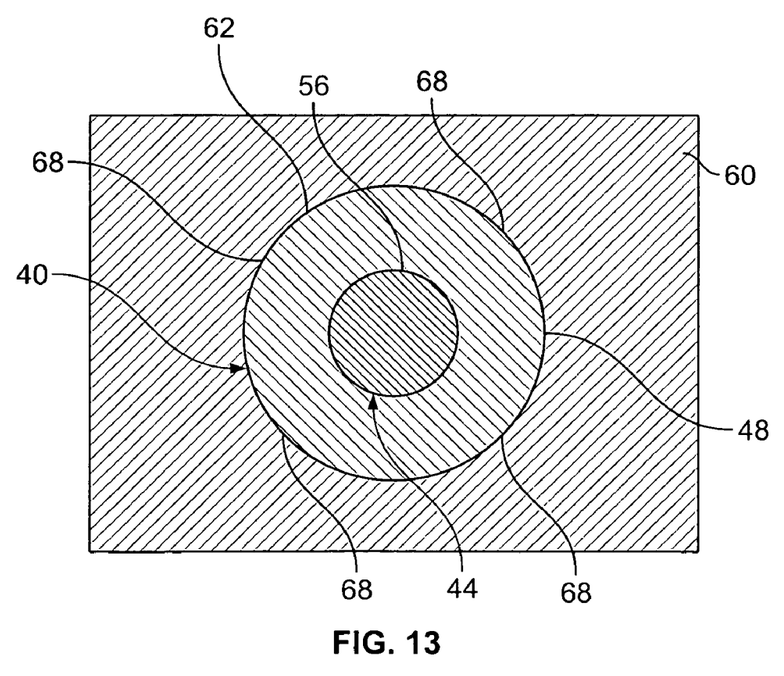
FIG. 13 illustrates a cross-sectional view of a shaft of a fastening support assembly through line 13-13 of FIG. 12 according to an embodiment of the present invention.

FIG. 13 illustrates a cross-sectional view of the shaft 48 of the fastening support assembly 40 through line 13-13 of FIG. 12. The shaft 48 and the pin shaft 56 occupy the space within the hole 62. That is, the area of the hole 62 is filled with solid material of the fastening support assembly 40, namely a portion of the shaft 48 proximate the cap 46 (shown in FIG. 12), and the pin shaft 56 within the shaft 48. The outer circumferential area of the shaft 48 abuts the circumferential edges 68 that define the hole 62. Further, the outer circumferential area of the pin shaft 56 abuts the circumferential edges of the shaft 48 that define the internal chamber 52 (shown, e.g., in FIGS. 7, 9, and 10). As such, there is a complete cross-section of material, such as the plastic of the fastening support assembly 40, within the hole 62. Any shearing force exerted into the fastening support assembly 40 is spread out over the entire shaft of material (i.e., the pin shaft 56 and the shaft 48) within the hole 62, thereby providing greater resistance to snapping or breaking as compared to the conventional fastening support 10 shown and described in FIGS. 1-6. In short, the fastening support assembly 40 is stronger and more robust than the conventional fastening support 10. Thus, embodiments of the present invention provide a more resilient, robust fastening support assembly.

While various spatial terms, such as front, rear, upper, bottom, lower, mid, lateral, horizontal, vertical, and the like may used to describe embodiments of the present invention, it is understood that such terms are merely used with respect to the orientations shown in the drawings. The orientations may be inverted, rotated, or otherwise changed, such that a front portion is a rear portion, and vice versa, horizontal becomes vertical, and the like.

Variations and modifications of the foregoing are within the scope of the present invention. It is understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention. The claims are to be construed to include alternative embodiments to the extent permitted by the prior art.

Various features of the invention are set forth in the following claims.

The invention claimed is:

1. A fastening support assembly configured to securely connect a first panel above a second panel, the fastening support assembly comprising:
   a shaft having a cap at a first end and a distal tip at a second end, said shaft defining an internal chamber, said distal tip being configured to secure to the first panel; and
   a pin positioned within said internal chamber, wherein axial movement of said pin from outside said internal chamber into said internal chamber radially expands said shaft, wherein a portion of said shaft and said pin proximate said cap are configured to substantially fill a hole formed through the second panel when the second panel is secured to the fastening support assembly.

2. The fastening support assembly of claim 1, wherein a circumferential area of said shaft configured to be within the hole is configured to abut circumferential edges of the second panel that define the hole.

3. The fastening support assembly of claim 2, wherein said pin fills an internal space formed through said shaft proximate said cap.

4. The fastening support assembly of claim 1, wherein the second panel is configured to be compressively sandwiched between said shaft and said cap when said pin radially expands said shaft.

5. The fastening support assembly of claim 1, wherein at least one of said shaft and said pin are formed of plastic.

6. A fastening support assembly configured to securely connect a first panel above a second panel, the fastening support assembly comprising:
   a shaft integrally connected to a cap at a first end and a distal tip at a second end, said shaft defining an internal chamber, said distal tip being configured to secure to the first panel, wherein movement of a pin from outside said internal channel into said internal chamber radially expands said shaft in order to secure said shaft within a hole of the second panel, wherein a circumferential area of said shaft is configured to abut circumferential edges of the hole formed through the second panel when said shaft is radially expanded.

7. The fastening support assembly of claim 6, wherein the pin fills an internal space formed through said shaft proximate said cap.

8. The fastening support assembly of claim 6, wherein the second panel is configured to be compressively sandwiched between said shaft and said cap when the pin radially expands said shaft.

9. The fastening support assembly of claim 6, wherein said shaft is formed of plastic.

10. A fastening support system comprising:
    a chassis having a first hole formed therethrough;
    a circuit board having a second hole formed therethrough;
    a fastening support assembly that securely supports said circuit board with respect to said chassis, said fastening support assembly comprising:
       a shaft having a cap at a first end and a distal tip at a second end, said shaft defining an internal chamber, a portion of said shaft proximate said cap being positioned within said first hole, said distal tip securely mating into said second hole; and
       a pin positioned within said internal chamber, wherein movement of said pin into said internal chamber radially expands said shaft in order to secure said shaft into said first hole, wherein a cross-sectional area of said shaft and said pin proximate said cap completely fills said first hole.

11. The fastening support system of claim 10, wherein a circumferential area of said shaft within said first hole abuts circumferential edges of the chassis that define said first hole.

12. The fastening support system of claim 11, wherein said pin fills an internal space formed through said shaft proximate said cap.

13. The fastening support system of claim 10, wherein said chassis is compressively sandwiched between said shaft and said cap when said pin radially expands said shaft.

14. The fastening support system of claim 10, wherein at least one of said at least one of said shaft and said pin is formed of plastic.

* * * * *